(12) United States Patent
Singh et al.

(10) Patent No.: US 10,134,737 B2
(45) Date of Patent: Nov. 20, 2018

(54) MEMORY DEVICE WITH REDUCED-RESISTANCE INTERCONNECT

(71) Applicant: Taiwan Semiconductor Manufacturing Co., Ltd., Hsin-Chu (TW)

(72) Inventors: Sahil Preet Singh, Hsinchu (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/384,373

(22) Filed: Dec. 20, 2016

(65) Prior Publication Data

US 2017/0186750 A1 Jun. 29, 2017

Related U.S. Application Data

(60) Provisional application No. 62/272,187, filed on Dec. 29, 2015.

(51) Int. Cl.
| | |
|---|---|
| *H01L 21/768* | (2006.01) |
| *H01L 27/105* | (2006.01) |
| *G11C 5/06* | (2006.01) |
| *G11C 5/02* | (2006.01) |
| *H01L 23/522* | (2006.01) |
| *H01L 23/528* | (2006.01) |
| *G11C 8/08* | (2006.01) |
| *G11C 8/16* | (2006.01) |
| *G11C 7/12* | (2006.01) |

(52) U.S. Cl.
CPC .......... *H01L 27/1052* (2013.01); *G11C 5/025* (2013.01); *G11C 5/063* (2013.01);
(Continued)

(58) Field of Classification Search
CPC .......... H01L 21/76895; H01L 23/5226; H01L 27/1052; H01L 2224/25175;
(Continued)

(56) References Cited

U.S. PATENT DOCUMENTS

| | | | | | |
|---|---|---|---|---|---|
| 5,467,316 | A | * | 11/1995 | Kim ......................... | G11C 8/08 365/149 |
| 5,841,688 | A | * | 11/1998 | Sukegawa .............. | G11C 5/063 257/758 |
| 6,191,999 | B1 | * | 2/2001 | Fujieda .................... | G11C 8/10 365/230.03 |

(Continued)

*Primary Examiner* — Galina Yushina
(74) *Attorney, Agent, or Firm* — Eschweiler & Potashnik, LLC

(57) ABSTRACT

An interconnect structure includes a lower interconnect layer, an intermediate interconnect layer, and an upper interconnect layer. First and second conductive lines in the lower interconnect layer extend generally in a first direction over a memory array region, and additional lower conductive lines in the lower interconnect layer extend generally in the first direction over a peripheral region. A first plurality of conductive line segments in the intermediate interconnect layer extend generally in the first direction over the memory array region, and additional intermediate conductive line segments in the intermediate interconnect layer extend generally in a second, perpendicular direction over the peripheral region. A second plurality of conductive line segments in the upper interconnect layer extend generally in the first direction over the memory array region, and additional upper conductive line segments in the upper interconnect layer extend generally in the first direction over the peripheral region.

20 Claims, 10 Drawing Sheets

(52) U.S. Cl.
CPC ............. *G11C 8/08* (2013.01); *G11C 8/16* (2013.01); *H01L 21/76895* (2013.01); *H01L 23/528* (2013.01); *H01L 23/5226* (2013.01); *G11C 7/12* (2013.01); *H05K 999/99* (2013.01)

(58) Field of Classification Search
CPC . H01L 2224/41175; H01L 2224/49175; G11C 5/025; G11C 5/063; G11C 8/14; G11C 7/16

See application file for complete search history.

(56) References Cited

U.S. PATENT DOCUMENTS

| | | | | |
|---|---|---|---|---|
| 6,266,264 | B1 * | 7/2001 | Proebsting | G11C 7/065 257/E21.659 |
| 6,552,951 | B1 * | 4/2003 | Raj | G11C 8/16 365/102 |
| 7,006,369 | B2 * | 2/2006 | Venkatraman | G11C 7/18 257/903 |
| 7,046,578 | B2 * | 5/2006 | Tomishima | G11C 8/14 365/230.06 |
| 7,570,504 | B2 * | 8/2009 | Vo | G11C 5/063 365/230.06 |
| 7,684,245 | B2 * | 3/2010 | Schumann | G11C 16/3418 365/185.05 |
| 2003/0117827 | A1 | 6/2003 | Nishizaka et al. | |
| 2007/0025132 | A1 * | 2/2007 | Liaw | G11C 5/063 365/63 |
| 2011/0299317 | A1 * | 12/2011 | Shaeffer | G11C 13/0002 365/106 |
| 2014/0346611 | A1 | 11/2014 | Oh | |

* cited by examiner

US 10,134,737 B2

MEMORY DEVICE WITH REDUCED-RESISTANCE INTERCONNECT

REFERENCE TO RELATED APPLICATION

This Application claims priority to U.S. Provisional Application No. 62/272,187 filed on Dec. 29, 2015, the contents of which is hereby incorporated by reference in its entirety.

BACKGROUND

Semiconductor memory is an electronic data storage device implemented on a semiconductor-based integrated circuit, and generally has much faster access times than other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage mechanism for computer memory to hold data the computer is currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
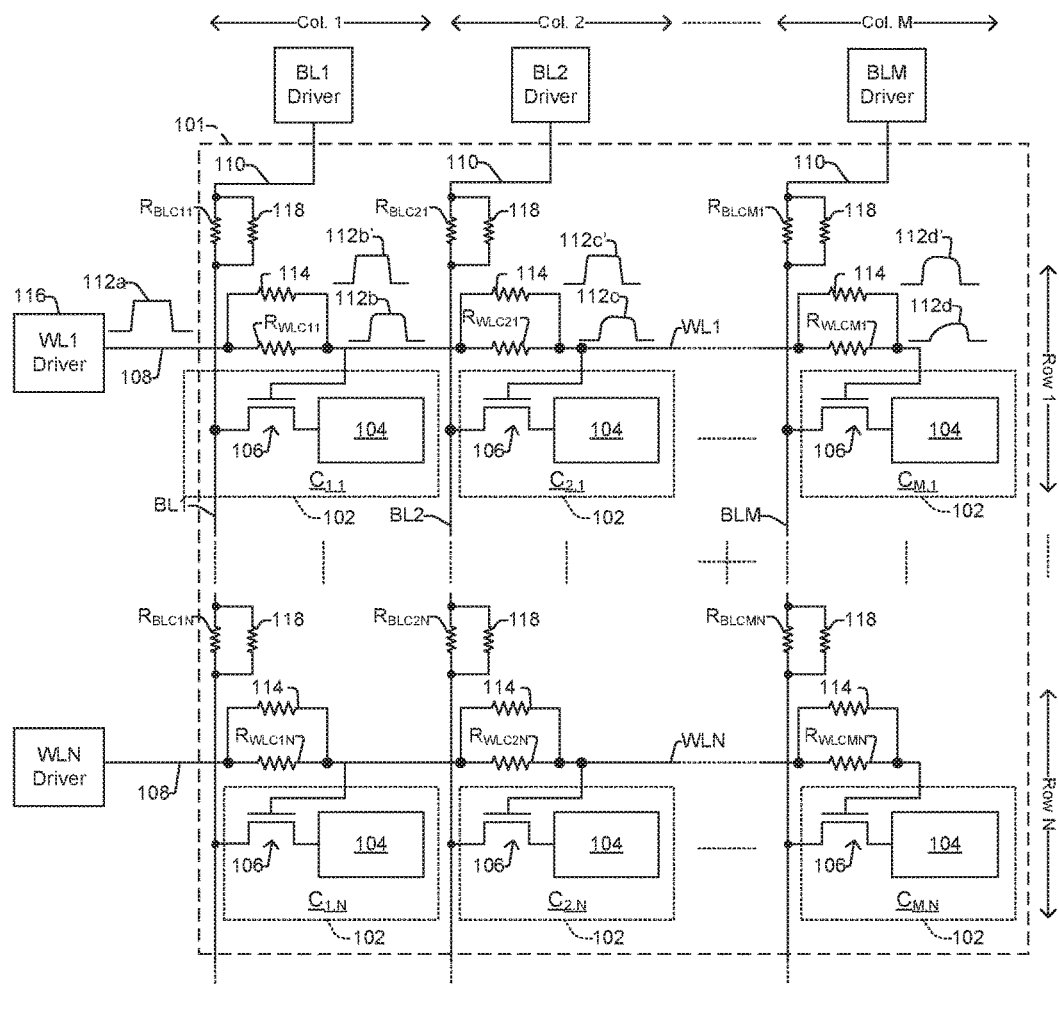
FIG. 1 illustrates a block diagram of a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory devices typically include an array of memory cells arranged in rows and columns. FIG. 1 shows an example of a memory device 100 that includes an array 101 in which a plurality of memory cells 102 are arranged in a series of M columns and N rows, where M and N can be any integers and can be the same or different from one another. For clarity, the individual memory cells 102 are labeled as $C_{COLUMN-ROW}$ in FIG. 1. In FIG. 1's example, the memory cells 102 are single-ended memory cells each having a single port, but as will be appreciated in more detail herein, in other embodiments memory cells can be differential rather than single-ended and/or can have multiple ports rather than a single port. See e.g., FIGS. 9-12 discussed further herein.

In FIG. 1, each memory cell 102 includes a data storage element 104 that is accessible through an access transistor 106 or other access device, such as a diode for example. Along each row, one or more wordlines 108 are coupled to gates of the access transistors 106 of that row; while along each column, one or more bitlines 110 are coupled to source/drains regions of the access transistors 106 along that column. To write data to a row of memory cells, the wordline 108 of the row is asserted to enable the access transistors 106 of the row, and then the bitlines 110 are biased to program data states to the individual data storage elements 104 of the accessed row. While data is being written a row, the wordlines 108 of the other rows are de-asserted such that the access transistors 106 of the other rows remain off and the biases applied to the bitlines 110 do not alter the states of the non-accessed rows. For example, to write to the memory cells of Row 1, WL1 driver 116 asserts wordline WL1 of Row 1, thereby coupling the data storage elements 104 of cells $C_{1,1}$ through $C_{M,1}$ to bitlines BL1 through BLM, respectively. While WL1 driver 116 is asserting WL1, the bitlines BL1 through BLM are individually biased to correspond to individual data values to be written to cells $C_{1,1}$ through $C_{M,1}$, respectively. This writes the individual data values to the accessed memory cells $C_{1,1}$ through $C_{M,1}$, such that after WL1 is de-asserted the written data values remain stored in the data storage elements 104 of memory cells $C_{1,1}$ through $C_{M,1}$.

The wordlines 108 and bitlines 110 are typically formed as conductive lines in an interconnect structure of the memory device 100. Though these conductive lines may be thought of as wires with negligible resistance, in fact, each conductive line, like any wire, has a small resistance which is proportional to its length. Thus, for example, the wordlines 108 and bitlines 110 are shown with a series of resistances over their length—for example, WL1 is shown as including unit resistances $R_{WLC11}$, $R_{WLC21}$, $R_{WLCM1}$; and BL1 is shown as including unit resistances $R_{BLC11}$, $R_{BLC1N}$. As feature sizes shrink for successive generations of technology, the wordlines 108 and bitlines 110 are becoming thinner, which tends to increase their resistances. This can lead to resistance-induced performance degradation for wordlines 108 and/or bitlines 110. For example, when WL1 driver 116 provides a wordline pulse signal at a near end of WL1 in FIG. 1 (see wordline pulse 112$a$), the shape of the wordline pulse signal may degrade as the wordline pulse signal propagates down the length of WL1 (see wordline pulses 112$b$-112$d$). The same can be true of bitlines.

To combat this signal degradation, in some embodiments, a number of conductive line segments 114 are formed over each of the wordlines 108 and are coupled to different locations on the wordlines 108. The conductive line segments 114 are coupled in parallel with the wordlines 108. The conductive line segments 114 have small resistances (which can be similar to that of the wordlines 108 and/or bitlines 110 on a unit length basis), but because they are arranged in parallel with the wordlines 108 the conductive line segments 114 effectively reduce the resistance seen by a wordline signal propagating down the length of a wordline, which limits signal degradation. Similarly, the conductive line segments 118 can be coupled in parallel with the bitlines 110 to reduce signal degradation on the bitlines.

In some embodiments, each wordline 108 can be a continuous metal1 line that extends in un-broken fashion over the entire wordline length for M columns, and the conductive line segments 114 can correspond to separate metal2 and/or metal3 segments which extend over each memory cell 102 and which extend generally in parallel with the wordline 108. The metal2 and/or metal3 conductive line segments 114 are coupled to different locations on the wordline 108, such that the metal2 and/or metal3 conductive line segments 114 establish a series of "bridges" over the wordline 108. Because the metal2 and/or metal3 conductive line segments 114 are arranged in parallel with the wordline 108, the resultant resistance of the wordline 108 and metal2 and/or metal3 conductive line segments 114 in parallel is less than the resistance of the wordline 108 alone. Thus, the resultant wordline signal exhibits reduced signal degradation (see improved wordline signals 112$b'$-112$d'$), compared to if only a single metal1 wordline were used. The wordlines 108 being in metal1 and conductive line segments 114 being in metal2 and/or metal3 is just an example for clarity, and does not any way limit the scope of the present disclosure. The wordlines 108 can also be formed in other layers, for example, polysilicon, metal2, metal3 metal4, metal5, etc., and the conductive line segments 114 can also be formed in another layer or in multiple layers, for example, polysilicon, metal1, metal2, metal3, metal4, metal5, etc. Often, the wordlines 108 and conductive line segments 114 are arranged in three or more immediately adjacent metal layers in the interconnect structure, but in some embodiments intervening metal layers can be disposed between the wordlines 108 and conductive line segments 114.

Figure 2A:
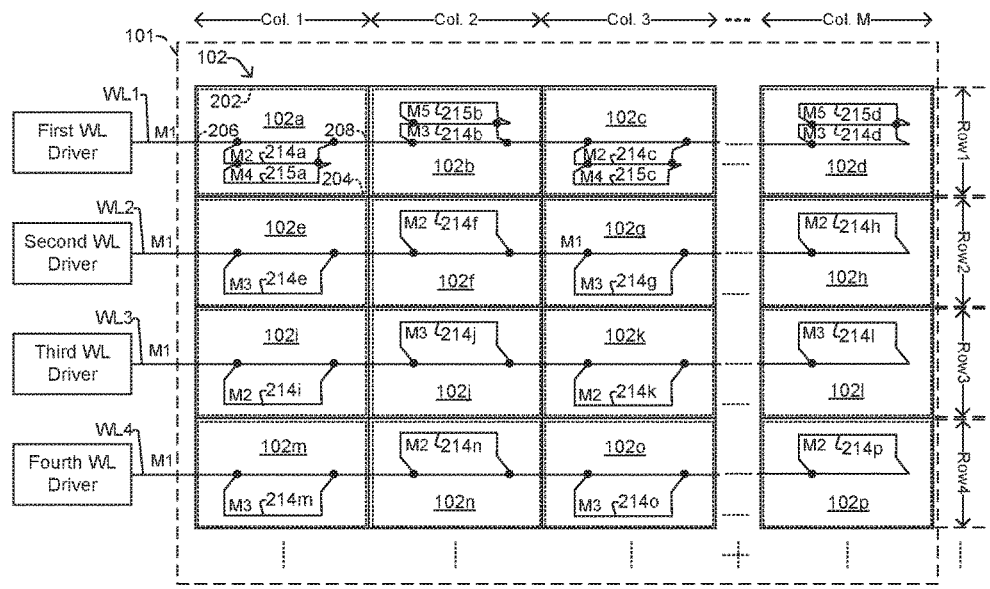
FIG. 2A illustrates a simplified layout or placement diagram for a memory device having a separate wordline extending over each individual row and conductive line segments arranged electrically in parallel over each separate wordline in accordance with some embodiments.

FIG. 2A depicts an example of a portion of a memory device 200A that includes an array 101 made up of a plurality of memory cells 102 arranged in M columns and 4 rows, with individual memory cells labeled 102$a$-102$p$, respectively. The contents of each memory cell 102$a$-102$p$ typically includes a data storage element and one or more access transistors (see e.g., FIG. 1's memory cells 102 with data storage elements 104 and access transistors 106), however, the data storage elements and access transistors are omitted from FIG. 2A for clarity. An outer perimeter circumscribes the contents of each memory cell 102$a$, 102$p$, respectively. For example, first memory cell 102$a$ has a rectangular outer perimeter made up of an upper edge 202, lower edge 204, left edge 206, and right edge 208. Though FIG. 2A illustrates the perimeter of each memory cell 102$a$-102$p$ as a rectangle whose width is larger than its height, in other embodiments, the outer perimeter of the memory cells may take the form of a rectangle whose height is larger than its width, or may take the form of another polygon with other than four edges. In some embodiments, the memory cells 102$a$-102$p$ are tiled together so their edges contact one another, thereby achieving a dense layout for the array 101.

In the array 101, a single wordline extends over each row and is coupled to gates of access transistors for that row. For example, wordline WL1 is coupled to gates of access transistors (not shown) for memory cells 102$a$, 102$b$, 102$c$, and 102$d$; while wordline WL2 is coupled to gates of access transistor (not shown) for memory cells 102$e$, 102$f$, 102$g$, and 102$h$. The wordlines WL1, WL2, WL3, WL4, . . . are electrically isolated from one another, but run geometrically in parallel with one another. For example, WL1 is illustrated as a first metal1 (M1) line that extends continuously and in unbroken fashion over Row1, WL2 is illustrated as a second M1 line that extends continuously and in unbroken fashion over Row2, and so on. To reduce the overall resistances associated with each wordline, a plurality of conductive line segments 214$a$-214$p$ are arranged at different locations on the wordlines and are arranged in parallel with the wordlines. Notably, adjacent conductive line segments along each wordline alternate between metal2 (M2) and metal3 (M3). Thus, in the first row (Row1), the first memory cell 102a has a first conductive line segment 214a that is a M2 line, the second memory cell 102b has a second conductive line segment 214b that is a M3 line, the third memory cell 102c has a third conductive line segment 214c that is a M2 line, and so on. Somewhat similarly, adjacent conductive line segments along each column also alternate between metal2 (M2) and metal3 (M3). Thus, along Col. 1, the first memory cell 102a has a conductive line segment 214a that is a M2 line, the second memory cell 102e has a second conductive line segment 214e that is a M3 line, the third memory cell 102i has a third conductive line segment 214i that is a M2 line, and so on. This alternating M2/M3 arrangement helps to achieve a more compact layout, and also offers good "balancing" in terms of capacitive loading and matching for the wordlines and bitlines of the array, thereby helps to provide favorable access times for the memory device 200A.

In some embodiments, the first and second wordlines WL1, WL2 may be referred to as first and second conductive lines; conductive line segments 214a, 214c may be referred to as a first plurality of conductive line segments; conductive line segments 214f, 214h may be referred to as a second plurality of conductive line segments; conductive line segments 214b, 214d may be referred to as a third plurality of conductive line segments; and conductive lines 214e, 214g may be referred to as a fourth plurality of conductive line segments. The first and third pluralities of conductive line segments 214a, 214c and 214b, 214d can be spaced at regular, equal intervals over WL1 and can have respective first lengths which are equal to one another. The second and fourth pluralities of conductive line segments can be spaced at regular, equal intervals over WL2 and can have respective second lengths which are equal to one another and which are equal to the respective first lengths.

In addition, in some embodiments, additional "higher" conductive line segments can also be stacked in parallel above the metal2 and metal3 conductive line segments. For example, in FIG. 2A, metal4 (M4) conductive line segments 215a, 215c are geometrically in parallel with and electrically in parallel with M2 conductive line segments 214a, 214c, respectively; and metal5 (M5) conductive line segments 215b, 215d are geometrically in parallel with and electrically in parallel with M3 conductive line segments 214b, 214d, respectively. Though only illustrated for Row1 of the array 101 in FIG. 2A, additional "higher" conductive line segments can also be present for the other rows and/or columns in some embodiments. If present, these higher conductive line segments can further reduce the effective wordline and/or bitline resistances.

Figure 2B:
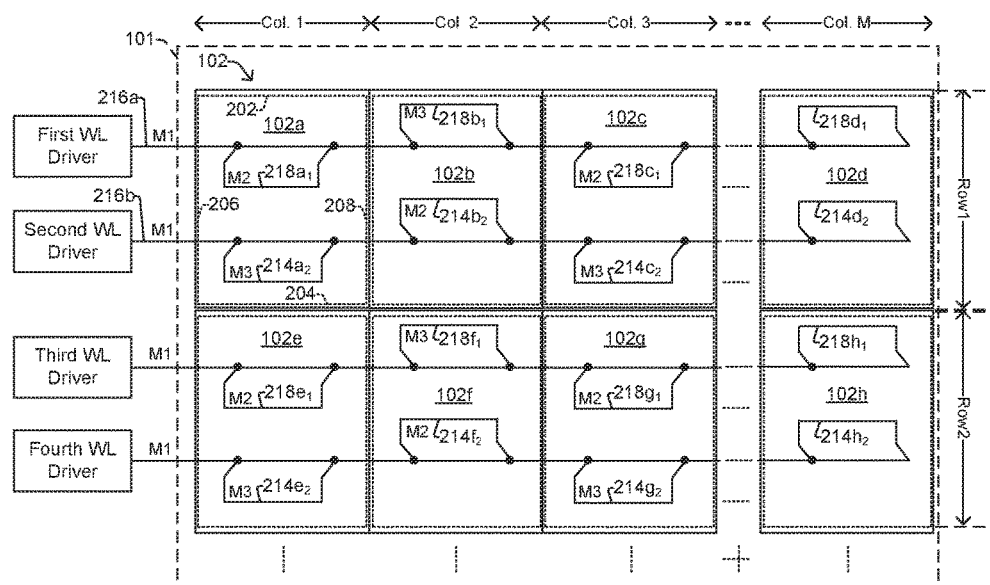
FIG. 2B illustrates a simplified layout or placement diagram for a memory device having a pair of wordlines extending over each individual row and conductive line segments arranged electrically in parallel over each wordline in accordance with some embodiments.

FIG. 2B depicts an example of a portion of another memory device 200B, such as a dual-port memory device (examples of which are described in more detail herein), which includes an array 101 made up of a plurality of memory cells 102. Compared to FIG. 2A where a single wordline extended over each row of memory cells, in FIG. 2B two wordlines extend over each row of cells and are coupled to gates of access transistors (not shown) for memory cells of the row. In the first row of the array, for example, wordlines 216a, 216b extend generally in parallel with one another and are coupled to the memory cells 102a-102d of the first row. Conductive line segments $218a_1$-$218d_1$ are disposed over the first wordline 216a and are electrically coupled in parallel with the first wordline 216a, while conductive line segments $218a_2$-$218d_2$ are disposed over the second wordline 216b and are electrically coupled in parallel with the second wordline 216b. Notably, adjacent conductive line segments along each wordline again alternate between metal2 (M2) and metal3 (M3), and adjacent conductive line segments along each column again alternate between M2 and M3. This helps to achieve a more compact layout, and also offers good "balancing" in terms of capacitive loading and matching for the wordlines and bitlines of the array, thereby helping to provide favorable access times for the memory device.

Figure 3:
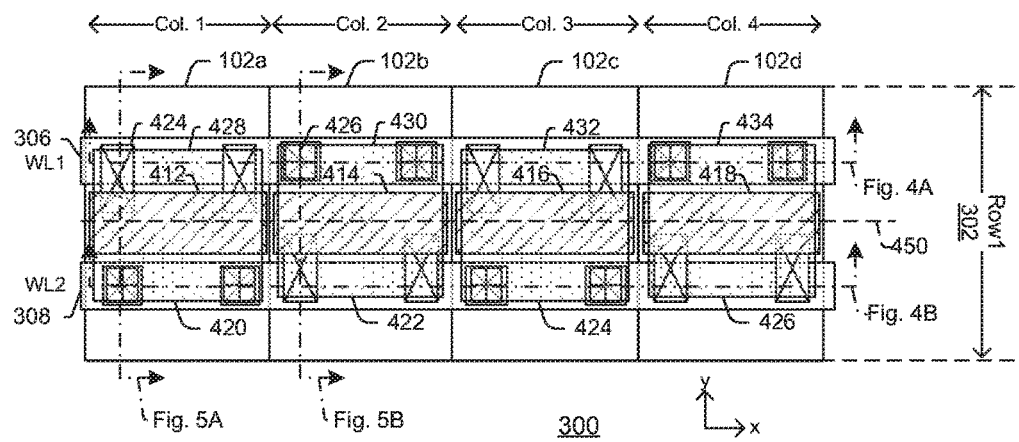
FIG. 3 illustrates a layout view for a row of dual-port memory cells in accordance with some embodiments.

FIG. 3 shows a layout view of a portion of a memory array 300, which includes a row 302 including four dual-port memory cells 102a-102d. Consistent with some embodiments of FIG. 2B, a first wordline WL1 306 and a second wordline WL2 308 extend generally in parallel with one another along the row 302. The first wordline WL1 is coupled to gates of access transistors corresponding to a first port for the dual-port memory cells 102a-102d, while the second wordline WL2 is coupled to gates of access transistors corresponding to a second port for the dual-port memory cells 102a-102d. Note that in other cases, FIG. 3 can alternatively be consistent with some embodiments of FIG. 2A, in that the wordlines WL1, WL2 can alternatively extend over first and second rows of memory cells that directly neighbor one another, and WL1 can be coupled to gates of access transistors for the first row of memory cells and WL2 can be coupled to gates of access transistors for the second row of memory cells.

Figure 4A:
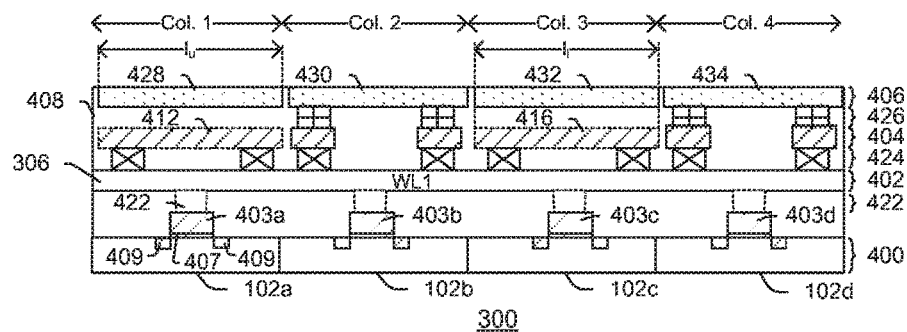
FIG. 4A-4B illustrate some embodiments of cross-sectional views taken in a first direction of a row of dual-port memory cells in accordance with FIG. 3.
Figure 4B:
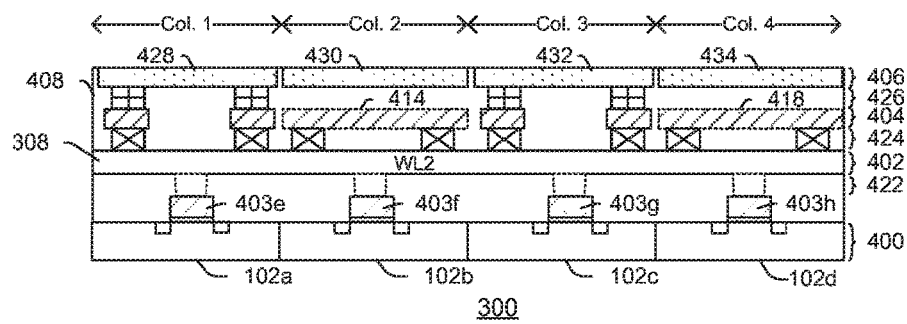

Referring briefly and concurrently to FIG. 3 and FIGS. 4A-4B, which show some embodiments of cross-sectional views of FIG. 3's layout, the first and second wordlines 306, 308 are formed in a lower interconnect layer 402, such as a metal1 layer, which is disposed over a semiconductor substrate 400. The first and second wordlines WL1, WL2 extend generally in parallel with one another in a first direction (e.g., x-direction) over a first row of memory cells 302. The first wordline WL1 is coupled to gates of access transistors (403a-403d) for a first port of the memory cells 102a-102d, and the second wordline WL2 is coupled to gates of access transistors (403e-403h) for a second port of the memory cells 102a-102d. The gates of the access transistors (403a-403h) can be made of polysilicon or metal, and are often separated from the semiconductor substrate 400 by a gate dielectric 407 such as silicon dioxide or a high-k dielectric. The access transistors also include source/drain regions 409 on opposite sides of the gates.

Conductive line segments (e.g., 412, 414, 416, 418, 428, 430, 434, 434), which can be formed for example in alternating fashion in an intermediate interconnect layer 404 (e.g., metal2 layer) and an upper interconnect layer 406 (e.g., metal3 layer) along the row, are arranged in the same direction with and electrically in parallel with the first and second wordlines WL1, WL2 to reduce the effective wordline resistance. For example, the conductive line segments and first and second wordlines generally extend along plane or axis 450 in FIG. 3. The first and second wordlines 306, 308 and conductive line segments are surrounded by a dielectric structure 408, such as made of low-k dielectric material or silicon dioxide, for example. Vias (such as via1 422, via2 424, and via3 426, for example), extend through the dielectric structure 408 to couple the first and second wordlines in parallel with the conductive line segments.

A first subgroup of the conductive line segments are formed in the intermediate interconnect layer 404, which resides over the lower interconnect layer 402. In the illustrated embodiment, the first subgroup of conductive line segments includes intermediate conductive line segments 412, 414, 416, and 418. In FIGS. 4A-4B, the outlines of intermediate conductive line segments 412-418 are shown in dashed form to show their approximate height and location, although they are actually slightly offset from these illustrated cross-sectional planes as can be seen from FIG. 3. The first intermediate conductive line segment 412 and third intermediate conductive line segment 416 are coupled to different locations on the first wordline WL1, and are each coupled in parallel with the first wordline WL1 through a pair of via2s (see e.g., FIG. 4A). The second intermediate conductive line segment 414 and fourth intermediate conductive line segment 418 are coupled to different locations on the second wordline WL2, and are each coupled in parallel with the second wordline WL2 through a pair of via2s (see e.g., FIG. 4B).

A second subgroup of the conductive line segments are formed in an upper interconnect layer 406, which resides over the intermediate interconnect layer 404. In the illustrated embodiment, the second subgroup of conductive line segments includes upper conductive line segments 428, 430, 432, 434. The first upper conductive line segment 428 and third upper conductive line segment 432 are coupled to different locations on the second wordline WL2, and are each coupled in parallel with the second wordline WL2 (see e.g., FIG. 4B). The second upper conductive line segment 430 and fourth upper conductive line segment 434 are coupled to different locations on the first wordline WL1, and are each coupled in parallel with the first wordline WL1 (see e.g., FIG. 4A). As can be seen, for example in FIG. 4A, the conductive line segments alternate between metal2 and metal3 layers along the first wordline WL1. Similarly, as can be seen for example in FIG. 4B, the conductive line segments alternate between metal 2 and metal3 layers along the second wordline WL2.

Figure 5A:
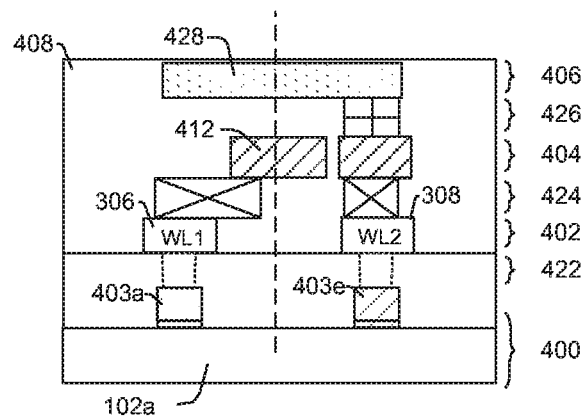
FIG. 5A-5B illustrate some embodiments of cross-sectional views taken in a second direction of a row of dual-port memory cells in accordance with FIG. 3.
Figure 5B:
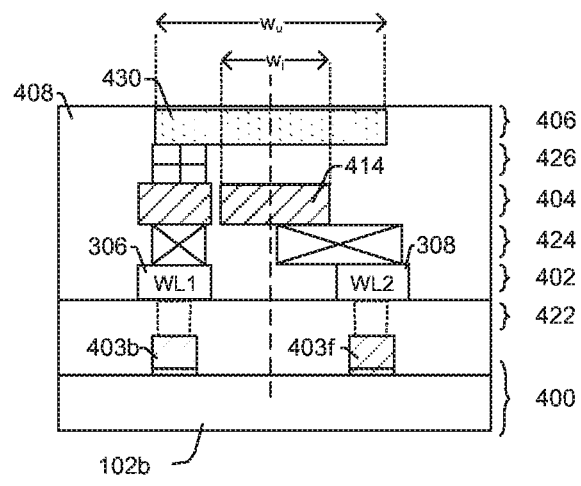

The conductive line segments are generally symmetric about the plane or axis 450 over the length of a given row to help "balance" the wordlines and/or bitlines over the array. For example, as illustrated in FIG. 5A-5B, the upper conductive line segments 428, 430, can each have a centerline that generally coincides with the plane or axis 450, and the intermediate conductive line segments 412, 414 can also have a centerline that generally coincides with the plane or axis 450. The upper conductive line segments can also have a width, $w_u$, which is greater than a width, $w_i$, of intermediate line segments, for example by a factor ranging from 110% to 300% in some embodiments. The upper conductive line segments can have respective upper line lengths, $l_u$, that are equal to one another, and the lower conductive line segments can have lower line lengths, $l_l$, that are equal to one another (see e.g., FIG. 4A). Often the lower line lengths are equal to the upper line lengths, but the lower line lengths can differ from the upper line lengths in other embodiments. In embodiments where the plane or axis 450 is equidistantly arranged between innermost edges of the first and second wordlines 306, 308, the equal and symmetric widths (as well as the equal lengths) helps facilitate balanced capacitive loading for the wordlines and/or bitlines. In other embodiments, the widths of the upper and lower conductive line segments can be "flipped", so the lower conductive line segments are wider than the upper conductive line segments, for example by a factor ranging from 110% to 300% in some embodiments. Further, the via2s 424 and via3s 426 can be arranged so that that they are arranged on alternating sides of the plane or axis 450 along the length of the wordline, which further facilitates balanced capacitive loading for the wordlines and/or bitlines.

The lower interconnect layer 402, intermediate interconnect layer 404, upper interconnect layer 406, and vias (e.g., 422, 424, 426) are often made of copper or copper alloy, however can be made of any conductive material. For example, in some embodiments, the wordlines and/or conductive line segments can be made of aluminum, nickel, silver, gold, or other metals, or can be made of doped polysilicon, for example. The vias can similarly be made of copper, copper alloy, aluminum, nickel, silver, gold, or other metals such as tungsten, or can be made of doped polysilicon. Further, the wordlines, vias, and conductive line segment features can be made of the same conductive material as one other in some embodiments, but in other embodiments one or more of these features can be made of a different conductive material from that of the other features.

In some embodiments, the first and second wordlines 306, 308 each have a first minimum line width, $w_1$; the intermediate conductive line segments 412, 414, 416, 418 each have a second minimum line width, $w_2$, which is greater than the first minimum line width, $w_1$; and the upper conductive line segments 428, 430, 432, 434 each have a third minimum line width, $w_3$, which is greater than the first minimum line width, $w_1$, and greater than or equal to the second minimum line width, $w_2$. This increased line width for metal lines which are higher in the interconnect structure can help to reduce current crowding issues for the chip as a whole, as the higher metal lines may carry larger current-, voltage-, and/or power-levels than lower metal lines in some situations.

In some embodiments, the conductive line segments can use "coloring" techniques to achieve further improvements in layout density. In "coloring" techniques, multiple masks are used for a single layer on the integrated circuit, such that the resultant single layer can have features that are more closely spaced than can be achieved with a single exposure photolithography step. Various combinations of coloring schemes can be used, some examples of which are described below.

In some embodiments, the first wordline 306 can be of a first color (e.g., a red color), and the second wordline 308 can be of a second color (e.g., a green color). Consequently, even if the lithography system used to form the first and second wordlines is capable of achieving some predetermined minimum resolution for a single mask step (such as nearest edges of first and second wordlines which are formed by a single mask being separated by 20 nm); lines of different colors can have edges that are separated by less than the predetermined minimum resolution (such as nearest edges of first and second wordlines of different colors being separated by only 10 nm). In this way, the first wordlines of neighboring memory cells can be formed using a first mask (e.g., red color) so the resultant first wordlines of the neighboring memory cells have a pitch corresponding to the minimum resolution (e.g., 20 nm). The second wordlines of neighboring memory cells can be formed using a second mask (e.g., green color) so the resultant second wordlines of the neighboring memory cells also have a pitch corresponding to the minimum resolution (e.g., 20 nm). Because the first wordlines are interspersed with the second wordlines on a single metal layer, the resultant spacing between an edge of the first wordline and a nearest edge of the second wordline can be less than the minimum resolution achievable by a single mask step.

The intermediate and upper interconnect layers can also use coloring techniques in various combinations with the lower interconnect layer. For example, in some embodiments where the first wordline 306 has a first color (e.g., red) and the second wordline 308 has a second color (e.g., green), the first and fourth intermediate conductive line segments 412, 418 can have the first color (e.g., red), and the second and third intermediate conductive line segments 414, 416 can have the second color (e.g., green). The first and fourth upper conductive line segments 428, 434 can have the first color (e.g., red), and the second and third upper conductive line segments 430, 432 can have the second color (e.g., green).

In other embodiments where the first wordline 306 has the first color (e.g., red) and the second wordline 308 has the second color (e.g., green), the first and fourth intermediate conductive line segments 412, 418 can have the first color (e.g., red), while the second and third intermediate conductive line segments 414, 416 can have the second color (e.g., green). The first and third upper conductive line segments 428, 432 can have the first color (e.g., red), and the second and fourth upper conductive line segments 430, 434 can have the second color (e.g., green).

In still other embodiments where the first wordline 306 has the first color (e.g., red) and the second wordline 308 has the second color (e.g., green), the first and third intermediate conductive line segments 412, 416 can have the first color (e.g., red), while the second and fourth intermediate conductive line segments 414, 418 can have the second color (e.g., green). The first and fourth upper conductive line segments 428, 434 can have the first color (e.g., red), and the second and third upper conductive line segments 430, 432 can have the second color (e.g., green).

In other embodiments where the first wordline 306 has the second color (e.g., green) and the second wordline 308 has the first color (e.g., red), the first and fourth intermediate conductive line segments 412, 418 can have the first color (e.g., red), while the second and third intermediate conductive line segments 414, 416 can have the second color (e.g., green). The first and fourth upper conductive line segments 428, 434 can have the first color (e.g., red), and the second and third upper conductive line segments 430, 432 can have the second color (e.g., green).

In further embodiments where the first wordline 306 has the second color (e.g., green) and the second wordline 308 has the first color (e.g., red), the first and fourth intermediate conductive line segments 412, 418 can have the first color (e.g., red), while the second and third intermediate conductive line segments 414, 416 can have the second color (e.g., green). The first and third upper conductive line segments 428, 432 can have the first color (e.g., red), and the second and fourth upper conductive line segments 430, 434 can have the second color (e.g., green).

In still further embodiments where the first wordline 306 has the second color (e.g., green) and the second wordline 308 has the first color (e.g., red), the first and third intermediate conductive line segments 412, 416 can have the first color (e.g., red), while the second and fourth intermediate conductive line segments 414, 418 can have the second color (e.g., green). The first and fourth upper conductive line segments 428, 434 can have the first color (e.g., red), and the second and third upper conductive line segments 430, 432 can have the second color (e.g., green).

Figure 6:
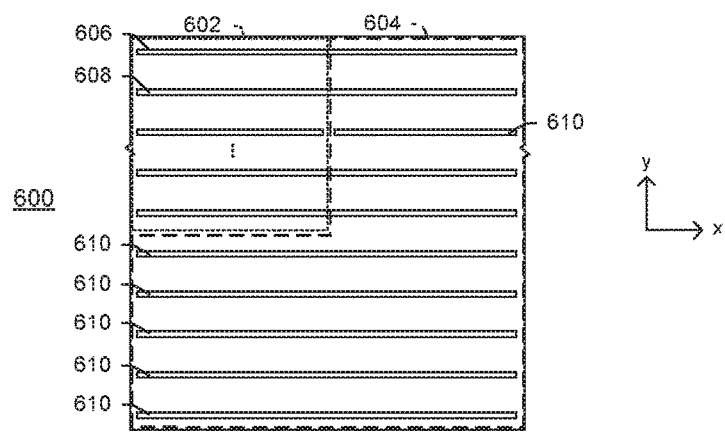
FIG. 6 illustrates a layout view for a series of lower metal lines, such as metal 1 lines that correspond to wordlines or bitlines, for an integrated circuit that includes a memory array region and peripheral region in accordance with some embodiments.
Figure 7:
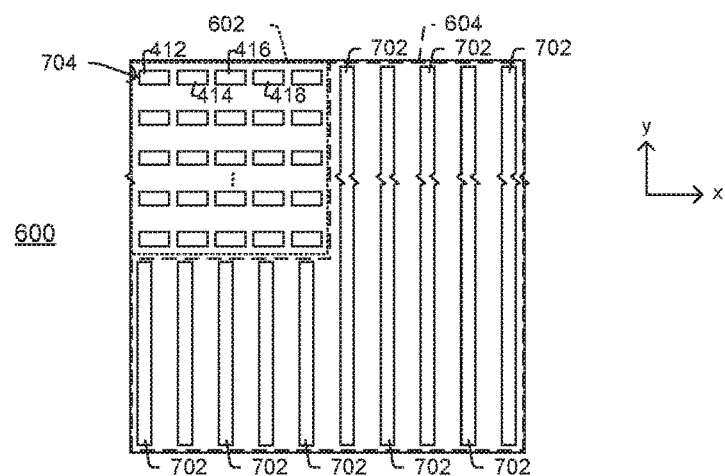
FIG. 7 illustrates a layout view for a series of intermediate conductive metal line segments, such as metal 2 lines that are disposed over FIG. 6's lower metal lines, for an integrated circuit that includes a memory array region and peripheral region in accordance with some embodiments.
Figure 8:
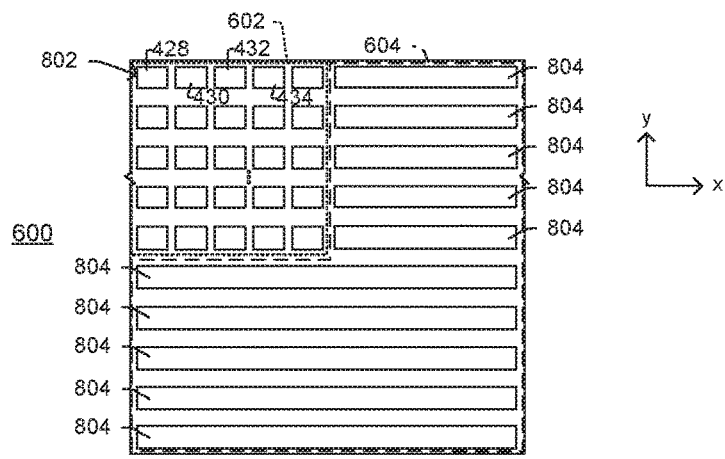
FIG. 8 illustrates a layout view for a series of upper conductive metal line segments, such as metal 3 lines that are disposed over FIG. 7's intermediate conductive lines, for an integrated circuit that includes a memory array region and peripheral region in accordance with some embodiments.

FIGS. 6-8 depict top views of a series of metal interconnect layers of a memory device 600 in accordance with some embodiments. FIG. 6 can correspond to a lower interconnect layer (e.g., 402 in FIGS. 3-5), FIG. 7 can correspond to an intermediate interconnect layer (e.g., 404 in FIGS. 3-5), and FIG. 8 can correspond to an upper interconnect layer (e.g., 406 in FIGS. 3-5). In each of these FIGS. 6-8, the memory device 600 includes a memory array region 602 and a peripheral region 604. The memory array region 602 corresponds to an array of memory cells (e.g., array 101 in FIG. 1), while the peripheral region 604 can correspond to peripheral circuitry operably coupled to the array, such as wordline drivers, bitline drivers, address decoder circuitry, input/output circuitry, ASIC logic, microcontroller or microprocessor logic, peripheral logic, or other types of circuitry. In conventional techniques, immediately adjacent metal interconnect layers have lines that run perpendicular to one another—for example, if metal1 interconnect lines extend in a first direction (e.g., x-direction), metal2 interconnect lines extend in a second direction (e.g., y-direction) perpendicular to the first direction, and metal3 interconnect lines again extend in the first direction (e.g., x-direction). In contrast, as shown in FIGS. 6-8, in some embodiments, the memory array region 602 includes metal interconnect lines in immediately adjacent metal layers that each run in the same direction as one another.

Thus, within the lower metal interconnect layer in FIG. 6 (which can correspond for example to a metal1 (M1) layer which includes M1 lines having a predetermined M1 width and spaced apart at an M1 pitch for example), first and second conductive lines 606, 608, which can manifest as wordlines WL1, WL2, respectively, extend in metal1 in a first direction (e.g., x-direction) over the memory array region 602. Additional lower conductive lines 610 can also extend in parallel with the first and second conductive lines 606, 608 in the first direction over the peripheral region 604.

Within the intermediate interconnect layer illustrated in FIG. 7 (which can correspond for example to a metal2 (M2) layer which includes M2 lines having a predetermined M2 width and spaced apart at an M2 pitch, with the M2 width and M2 pitch being optionally greater than the M2 width and M1 pitch, respectively), the peripheral region 604 has additional intermediate conductive line segments 702 that run in a second direction (e.g., y-direction), which is perpendicular to the first direction, as is typical for interconnect structures. However, a first plurality of conductive line segments 704 disposed within the intermediate interconnect layer in the memory array region 602 again extend in the first direction, and are in parallel with one another and in parallel with the first and second conductive lines 606, 608—which is contrary to conventional thinking. In some embodiments, the first plurality of conductive line segments 704 can correspond to intermediate conductive line segments 412, 414, 416, and 418 previously described with regards to FIGS. 3-5. This arrangement allows the intermediate conductive lines in the memory array region to be arranged electrically in parallel with and geometrically in parallel with the wordlines, thereby reducing the effective wordline resistance and improving read and write access speeds.

Within the upper interconnect layer illustrated in FIG. 8 (which can correspond for example to a metal3 (M3) layer which includes M3 lines having a predetermined M3 width and spaced apart at an M3 pitch, with the M3 width and M3 pitch being optionally greater than the M1 or M2 width and M1 or M2 pitch, respectively), the memory array region 602 and peripheral region 604 both have metal lines that run in the first direction (e.g., x-direction), as is typical for interconnect structures. Thus, a second plurality of upper conductive line segments 802 in the upper metal interconnect layer extend generally in the first direction over the memory array region 602, and additional upper conductive line segments 804 in the upper metal interconnect layer extend generally in the first direction over the peripheral region 604. In some embodiments, the second plurality of conductive line segments 802 can correspond to upper conductive line segments 428, 430, 432, and 434 previously described with regards to FIGS. 3-5.

FIGS. 9-12 provide several different example memory architectures making use of two or more conductive lines which have conductive line segments arranged generally in parallel over the two or more conductive lines. In the examples of FIGS. 9-12, the two or more conductive lines correspond to wordlines of these various memory architectures; however, it will be appreciated in that other embodiments, the two or more conductive lines can correspond to bitlines or other conductive lines that extend generally in parallel with one another over a row or column of cells. Thus, FIGS. 9-12 should not be construed as limiting, but are merely examples of a few ways in which the disclosure can manifest itself.

Figure 9:
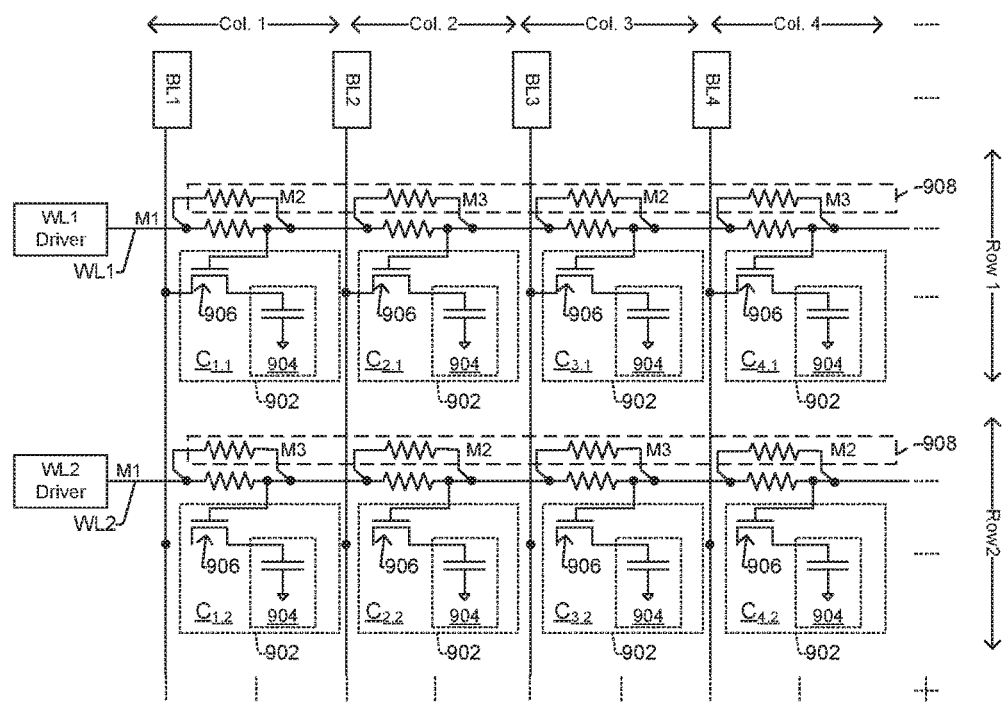
FIG. 9 illustrates a schematic diagram of some embodiments of a memory device that includes single-ended, single port memory cells having a series of conductive line segments that extending generally in parallel over each row in accordance with some embodiments.

FIG. 9 illustrates a block diagram of a memory device 900 where a memory array includes a plurality of single-ended, single port memory cells 902, each of which includes an access transistor 906 and a single-ended data storage element 904, such as a trench capacitor or metal-insulator-metal (MIM) capacitor for example.

Along each row, a wordline is coupled to memory cells at the intersection of the row and each column. For example, in Row 1, a wordline WL1 is coupled to gate electrodes of access transistors 906 for cells $C_{1,1}$-$C_{4,1}$. A single bitline extends along each column, and is coupled to source/drain regions of access transistors 906 along the column. Conductive line segments 908 are coupled in parallel with the wordlines. A first subset of conductive line segments are coupled to odd memory cells along each row, and a second subset of conductive line segments are coupled to even memory cells along that row. In some embodiments, the wordlines and the first and second subsets of conductive line segments are arranged in a first direction and are arranged geometrically in parallel with one another and to be electrically in parallel with one another. In some embodiments, the wordlines are metal1 lines, the first subset of conductive line segments over the odd rows are metal 2 lines, and the second subset of conductive line segments over the even rows are metal 3 lines, although these wordlines and conductive line segments could also be formed in other interconnect layers in other embodiments.

Figure 10:
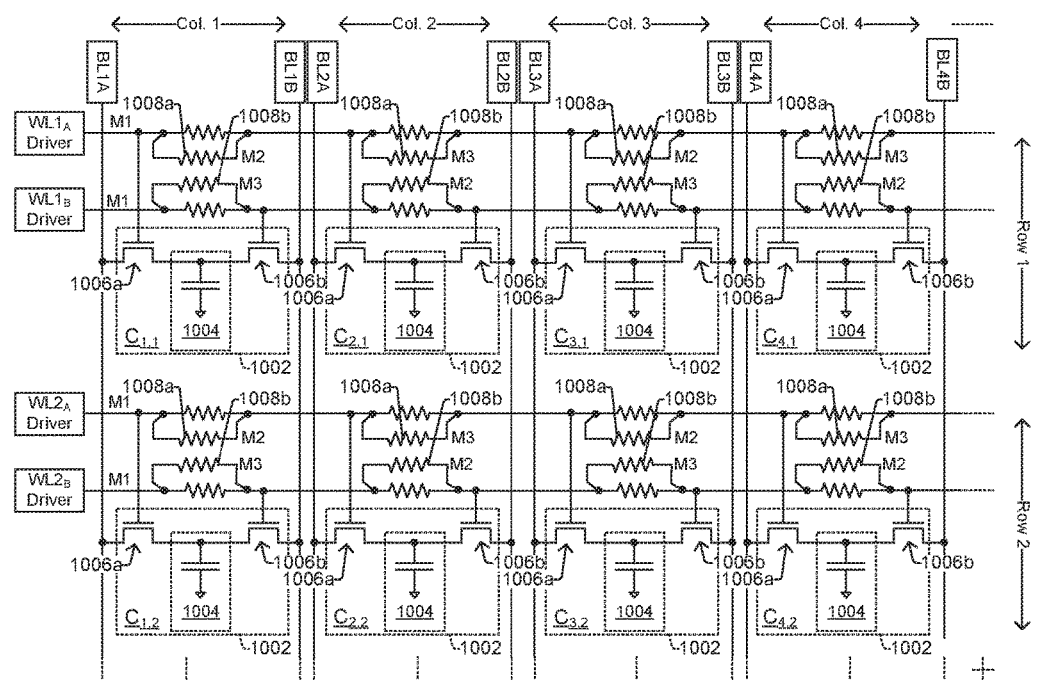
FIG. 10 illustrates a schematic diagram of some embodiments of a memory device that includes single-ended, dual-port memory cells having a series of conductive line segments that extending generally in parallel over each row in accordance with some embodiments.

Whereas FIG. 9 illustrated a memory device 1100 made up of single-ended, single-port memory cells 902, FIG. 10 shows a memory device 1000 made up of single-ended, dual-port memory cells 1002. Each dual-port memory cell 1002 includes a dual-port, single-ended data storage element 1004, such as a capacitor. Each dual-port memory cell 1002 also includes a pair of access transistors 1006a, 1006b.

In the memory device 1000, read and write operations can be made through two "ports", which are indicated by subscripts "A" and "B" in FIG. 10. Each port has its own set of wordlines and its own set of bitlines, which are separate from those of the other port. For example, along the rows of the array, port A includes wordlines WL1A, WL2A, . . . , WLNA, while port B includes wordlines WL1B, WL2B, . . . , WLNB. Along the columns of the array, port A includes bitlines $BL_{1A}$, $BL_{2A}$, . . . ; while port B includes bitlines $BL_{1B}$, $BL_{2B}$, . . . . A number of conductive line segments are coupled in parallel with the wordlines for each row.

Each dual-port memory cell 1002 resides at an intersection of a row and column and can be accessed through the two ports. Moreover, because of the two port design, data can be read to or written to two different rows of the array at the same time. For example, a first row of memory cells (e.g., cells $C_{1,1}$ through $C_{4,1}$ of Row 1) can be accessed through a port A wordline (e.g., through WL1A), and the bitlines of port A can be used to read and/or write values to the accessed row. At the same time, a second row of memory cells (e.g., cells $C_{1,2}$ through $C_{4,2}$ of Row 2) can be concurrently accessed through port B wordline (e.g., through WL2B), and the bitlines of port B can be used to read from or write to the second row of accessed memory cells. A first subset of the plurality of conductive line segments 1008a are coupled to the wordline corresponding to the first port of each memory cell along the row (e.g., WL1A), and a second subset of the plurality of conductive line segments 1008b are coupled to the second port of each memory cell along the row (e.g., WL1B). The first subset of the plurality of conductive line segments 1008a can be arranged in an intermediate interconnect layer over the wordlines, and the second subset of the plurality of conductive line segments 1008b can be arranged in an upper interconnect layer over the intermediate interconnect layer. The conductive lines segments reduce the resistance of the wordlines for port A and port B, thereby reducing signal degradation.

Figure 11:
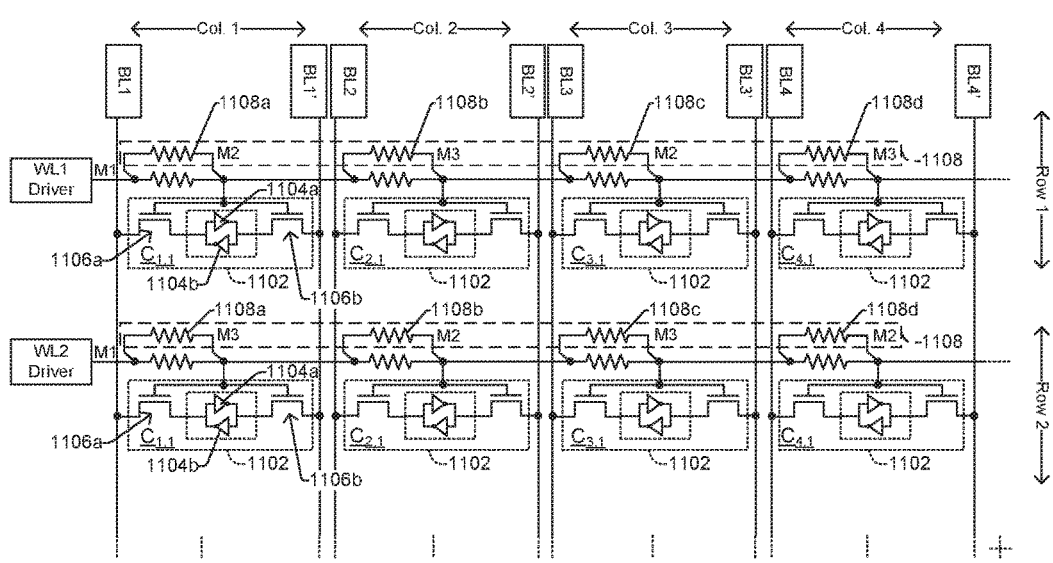
FIG. 11 illustrates a schematic diagram of some embodiments of a memory device that includes differential, single port memory cells having a series of conductive line segments that extending generally in parallel over each row in accordance with some embodiments.

FIG. 11 illustrates another block diagram of a memory device 1100, such as an SRAM device, that makes use of interleaved wordlines which extend over rows of differential, single-port memory cells 1102. Each memory cell includes a pair of cross-coupled inverters (e.g., 1104a, 1104b), which establish complementary data storage nodes, and a pair of access transistors (e.g., 1106a, 1106b).

Along each row, a wordline is coupled to each memory cell of the row. Along each column, a pair of complementary bitlines extend over the column and are coupled to source/drain regions of access transistors along the column. The bitlines are complementary in that if one bitline of a pair of complementary bitlines carries a logical "1" value, the other bitline of the pair generally carries a logical "0", or vice versa.

A number of conductive line segments 1108 extend over the wordline for each row. The conductive line segments 1108 are coupled to be electrically in parallel with the wordlines of the row. For example, along Row 1, a first subset of conductive line segments (e.g., 1108a, 1108c, which can be disposed in an intermediate interconnect layer over the wordlines), are coupled to odd memory cells along the row, and a second subset of conductive line segments (e.g., 1108b, 1108d, which can be disposed in an upper interconnect layer over the wordlines) are coupled to even memory cells along the row. The conductive line segments 1108 being coupled in parallel with the wordline can further reduce the signal propagation delay and signal degradation, thereby improving performance.

Figure 12:
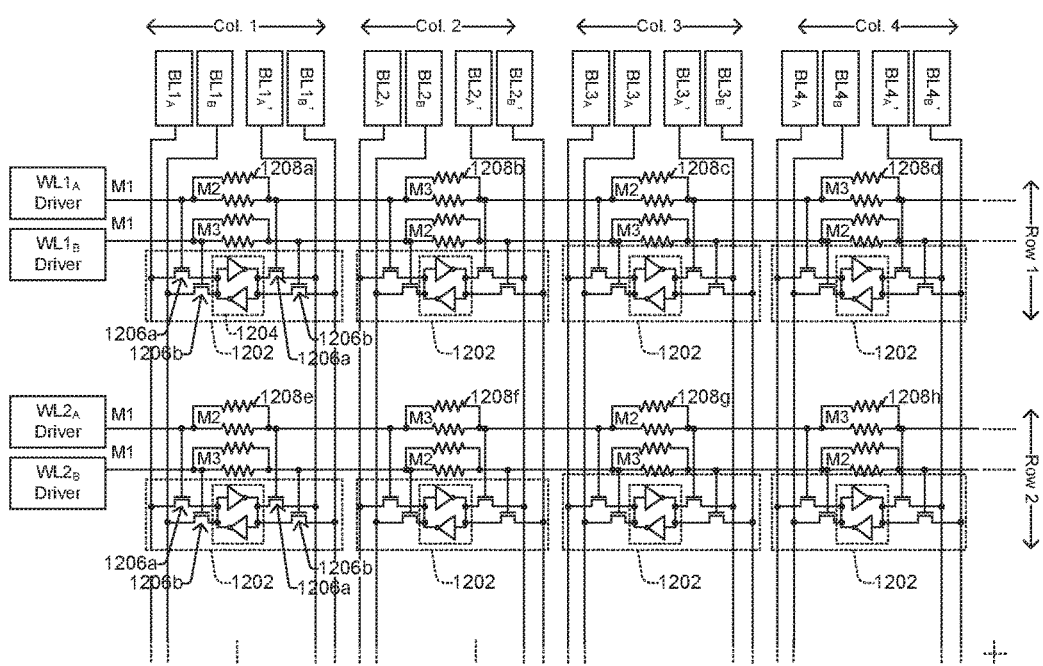
FIG. 12 illustrates a schematic diagram of some embodiments of a memory device including differential, dual-port memory cells having a series of conductive line segments that extending generally in parallel over each row in accordance with some embodiments.

FIG. 12 shows another embodiment of a memory device 1200 made up of differential, dual-port memory cells 1202. Each memory cell includes a pair of cross-coupled inverters (e.g., 1204), which establish complementary data storage nodes, and two pairs of access transistors. The first pair of access transistors (1206a) allows access to the complementary data storage nodes through a first ("A") port, while the second pair of access transistors (1206b) allows access to the complementary data storage nodes through a second ("B") port.

The "A" port and "B" port each has its own set of wordlines and its own set of bitlines, which are separate from those of the other port. For example, along the rows of the array, port A includes wordlines WL1A, WL2A, . . . , WLNA, while port B includes wordlines WL1B, WL2B, . . . , WLNB. Along the columns of the array, port A includes complementary bitline pairs $BL_{1A}$/$BL_{1A'}$, $BL_{2A}$/$BL_{2A'}$, . . . ; while port B includes bitline pairs $BL_{1B}$/$BL_{1B'}$, $BL_{2B}$/$BL_{2B'}$, . . . . Conductive line segments 1208 extend over the rows of cells, and are electrically coupled in parallel with the wordlines of the row. For example, along Row 1, a first subset of conductive line segments (e.g., 1208a, 1208c, which can be disposed in an intermediate interconnect layer over the wordlines) are coupled to odd memory cells along Row1, and a second subset of conductive line segments (e.g., 1208b, 1208d, which can be disposed in an upper interconnect layer over the wordlines) are coupled to even memory cells along Row1. The conductive line segments 1208 being coupled in parallel with the dual-port wordlines can further reduce the signal propagation delay and signal degradation, thereby improving performance.

Figure 13:
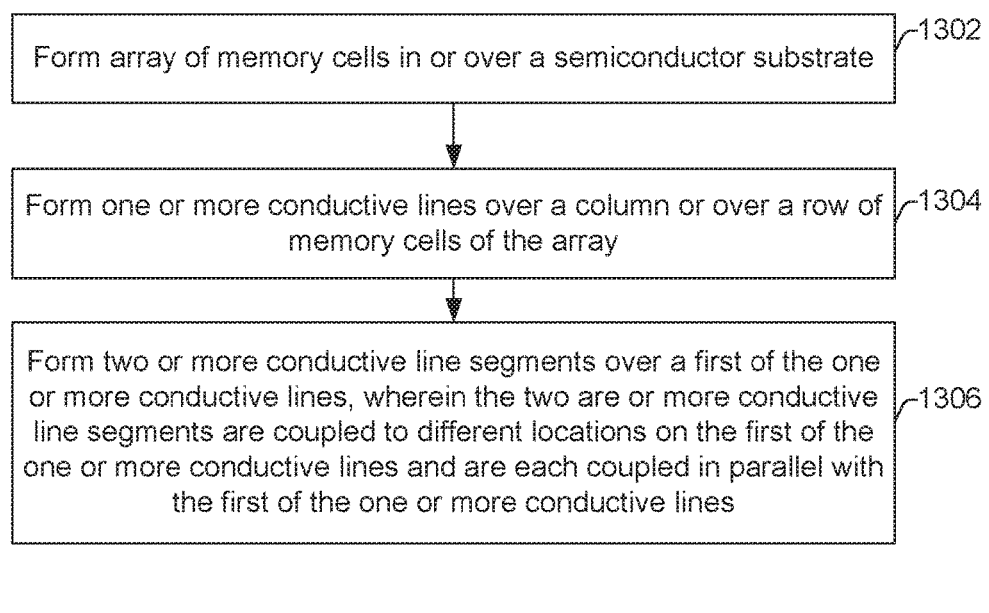
FIG. 13 illustrates a method in flowchart format in accordance with some embodiments.

FIG. 13 illustrates a flowchart in accordance with some embodiments. While the disclosed methods (e.g., method 1300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, an array of memory cells is formed in or over a semiconductor substrate. For example, 1302 can correspond to forming an array 101 of memory cells 102 as shown in FIG. 1.

At 1304, one or more conductive lines are formed over a column or over a row of memory cells of the array. For example, 1304 can correspond to forming a plurality of wordlines 108 which extend over the array, as shown in FIG. 1. Alternatively, 1304 can correspond to forming a plurality of bitlines which extend over the array, or forming a plurality of other lines over the array.

At 1306, two or more conductive line segments are formed over a first of the one or more conductive lines. The two or more conductive line segments are coupled to different locations on the first of the one or more conductive lines, and each are coupled in parallel with the first of the one or more conductive lines. For example, 1306 can correspond to forming two or more conductive line segments 114 as shown in FIG. 1.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first column" described in connection with a first figure may (or may not) correspond to a "first column" described in connection with a second figure (e.g., or may even correspond to a "second column" in the second figure), and may (or may not) correspond to a "first column" in an un-illustrated embodiment. Further, because a left-most cell in a row can be thought of as the zeroth cell or the first cell of the row, the terms "even" and "odd" can be transposed depending on the arbitrary convention assigned to the first cell of the row.

Thus, some embodiments of the present disclosure relate to a memory device. First and second conductive lines, which are coupled to memory cells of a row of memory cells, extend generally in parallel within a lower interconnect layer over the row of memory cells. A first plurality of conductive line segments are disposed within an intermediate interconnect layer over the lower interconnect layer. Conductive line segments of the first plurality of conductive line segments are coupled to different locations on the first conductive line and are electrically coupled in parallel with the first conductive line. A second plurality of conductive line segments are disposed in the intermediate interconnect layer. Conductive line segments of the second plurality of conductive line segments are coupled to different locations on the second conductive line WL2 and are electrically coupled in parallel with the second conductive line, the second plurality of conductive line segments are geometrically parallel to the first plurality of conductive line segments. A third plurality of conductive line segments are disposed in an upper interconnect layer disposed over the intermediate interconnect layer. Conductive line segments of the third plurality of conductive line segments are coupled to different locations on the first conductive line and are electrically coupled in parallel with the first conductive line. A fourth plurality of conductive line segments are disposed in the upper interconnect layer. Conductive line segments of the fourth plurality of conductive line segments are coupled to different locations on the second conductive line and are electrically coupled in parallel with the second conductive line. The fourth plurality of conductive line segments are geometrically parallel to the second plurality of conductive line segments.

In other embodiments, the present disclosure relates to a memory device including a memory array region and a peripheral region. An interconnect structure is arranged over the memory array region and the peripheral region, and includes a lower interconnect layer M1, an intermediate interconnect layer M2, and an upper interconnect layer M3. First and second conductive lines in the lower interconnect layer extend generally in a first direction over the memory array region, and additional lower conductive lines in the lower interconnect layer extend generally in the first direction over the peripheral region. A first plurality of conductive line segments in the intermediate interconnect layer extend generally in the first direction over the memory array region, and additional intermediate conductive line segments in the intermediate interconnect layer extend generally in a second direction, which is perpendicular to the first direction, over the peripheral region. A second plurality of conductive line segments in the upper interconnect layer extend generally in the first direction over the memory array region, and additional upper conductive line segments in the upper interconnect layer extend generally in the first direction over the peripheral region.

In still other embodiments, the present disclosure relates to a memory device including a plurality of dual-port memory cells arranged in rows and columns. A first wordline extends over a row of dual-port memory cells and is arranged within a lower interconnect layer. The first wordline is coupled to access transistors associated with a first port of the dual-port memory cells of the row. A second wordline extends over the row of dual-port memory cells and is arranged within the lower interconnect layer. The second wordline is generally in parallel with the first wordline and is coupled to access transistors associated with a second port of the dual-port memory cells of the row. A first plurality of conductive line segments are arranged over the first and second wordlines and are coupled to different locations on either the first wordline or the second wordlines. The first plurality of conductive line segments are generally geometrically in parallel with the first wordline and each of the first plurality of conductive line segments is electrically coupled in parallel with either the first wordline or the second wordline.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first conductive line and a second conductive line extending generally in parallel with one another within a lower interconnect layer over a row of memory cells, the first conductive line and the second conductive line being coupled to memory cells of the row;
a first plurality of conductive line segments disposed within an intermediate interconnect layer over the lower interconnect layer, wherein conductive line segments of the first plurality of conductive line segments are coupled to different locations on the first conductive line and are electrically coupled in parallel with the first conductive line;
a second plurality of conductive line segments disposed in the intermediate interconnect layer, wherein conductive line segments of the second plurality of conductive line segments are coupled to different locations on the second conductive line and are electrically coupled in parallel with the second conductive line, the second plurality of conductive line segments being geometrically parallel to the first plurality of conductive line segments;
a third plurality of conductive line segments being disposed in an upper interconnect layer disposed over the intermediate interconnect layer, wherein conductive line segments of the third plurality of conductive line segments are coupled to different locations on the first conductive line and are electrically coupled in parallel with the first conductive line; and
a fourth plurality of conductive line segments being disposed in the upper interconnect layer, wherein conductive line segments of the fourth plurality of conductive line segments are coupled to different locations on the second conductive line and are electrically coupled in parallel with the second conductive line, the fourth plurality of conductive line segments being geometrically parallel to the second plurality of conductive line segments;
wherein there is a one-to-one correspondence between a number of memory cells in the row and a sum of the first plurality of conductive line segments plus the third plurality of conductive line segments.

2. The memory device of claim 1, wherein the lower interconnect layer is immediately adjacent to the intermediate interconnect layer with only one layer of vias electrically connecting the lower interconnect layer to the intermediate interconnect layer.

3. The memory device of claim 2, wherein the intermediate interconnect layer is immediately adjacent to the upper interconnect layer with only one layer of vias electrically connecting the intermediate interconnect layer to the upper interconnect layer.

4. The memory device of claim 1, wherein the lower interconnect layer is a metal1 layer, the intermediate interconnect layer is a metal2 layer, and the upper interconnect layer is a metal3 layer.

5. The memory device of claim 1, wherein the memory device comprises a memory array region and a peripheral region spaced apart from the memory array region, wherein the first, second, third, and fourth plurality of conductive line segments are arranged generally in parallel in a first direction over the memory array region.

6. The memory device of claim 5:
wherein the lower interconnect layer comprises the first conductive line over the memory array region and a fifth plurality of conductive line segments in the peripheral region, the fifth plurality of conductive line segments arranged in parallel with the first conductive line;
wherein the intermediate interconnect layer comprises the second plurality of conductive line segments over the memory array region and a sixth plurality of conductive line segments in the peripheral region, the sixth plurality of conductive line segments arranged perpendicular to the second plurality of conductive line segments; and
wherein the upper interconnect layer comprises the third plurality of conductive line segments over the memory array region and a seventh plurality of conductive line segments in the peripheral region, the seventh plurality of conductive line segments arranged in parallel with the third plurality of conductive line segments.

7. The memory device of claim 1, wherein the conductive line segments of the first plurality of conductive line segments have respective first lengths which are equal to one another, and wherein the conductive line segments of the second plurality of conductive line segments have respective second lengths which are equal to one another and which are equal to the respective first lengths.

8. The memory device of claim 1, wherein the conductive line segments of the third plurality of conductive line segments have respective third lengths which are equal to one another, and wherein the conductive line segments of the fourth plurality of conductive line segments have respective fourth lengths which are equal to one another and which are equal to the respective third lengths.

9. The memory device of claim 1, wherein the first plurality of conductive line segments are collinear along a centerline between the first and second conductive lines, and the second plurality of conductive line segments are also collinear along the centerline between the first and second conductive lines, as viewed from over the row.

10. The memory device of claim 1, wherein the first conductive line and the second conductive line are each coupled to each memory cell along the row.

11. A memory device, comprising:
a memory array region corresponding to an array of memory cells;
a peripheral region spaced apart from the memory array region and corresponding to peripheral circuitry operably coupled to the array of memory cells; and
an interconnect structure arranged over the memory array region and the peripheral region, the interconnect structure comprising a lower interconnect layer, an intermediate interconnect layer, and an upper interconnect layer, which are disposed in a dielectric structure;

wherein first and second conductive lines disposed in the lower interconnect layer extend generally in a first direction over the memory array region, and additional lower conductive lines disposed in the lower interconnect layer extend generally in the first direction over the peripheral region and are arranged generally in parallel with the first and second conductive lines;

wherein a first plurality of conductive line segments disposed in the intermediate interconnect layer extend generally in the first direction over the memory array region, and additional intermediate conductive line segments in the intermediate interconnect layer extend generally in a second direction, which is perpendicular to the first direction, over the peripheral region; and wherein a second plurality of conductive line segments in the upper interconnect layer extend generally in the first direction over the memory array region, and additional upper conductive line segments in the upper interconnect layer extend generally in the first direction over the peripheral region.

12. The memory device of claim 11, wherein the first and second conductive lines each have a first minimum line width, and a conductive line segment in at least one of the first plurality of conductive line segments or the second plurality of conductive line segments has a second minimum line width that is greater than the first minimum line width.

13. The memory device of claim 11, wherein a first subset of the first plurality of conductive line segments are coupled electrically in parallel with the first conductive line, and a second subset of the second plurality of conductive line segments are coupled electrically in parallel with the second conductive line.

14. The memory device of claim 13, wherein the first subset of the first plurality of conductive line segments are spaced at regular intervals over a length of the first conductive line.

15. The memory device of claim 13, wherein memory cells arranged along a row are each accessible through a first port and a second port, wherein the first subset of the plurality of conductive line segments are coupled to the first port of each memory cell along the row, and wherein the second subset of the plurality of conductive line segments are coupled to the second port of each memory cell along the row.

16. The memory device of claim 11, wherein the first conductive line corresponds to a first wordline that is coupled to a gate electrode of a first access transistor of a first memory cell, and the second conductive line corresponds to a second wordline that is coupled to a gate electrode of a second access transistor of a second memory cell.

17. The memory device of claim 11, wherein the first conductive line corresponds to a first bitline that is coupled to a source/drain region of a first access transistor of a first memory cell of a row of memory cells in the memory array region, and the second conductive line corresponds to a second bitline that is coupled to a source/drain region of a second access transistor of a second memory cell of the row of memory cells.

18. A memory device, comprising:
a first conductive line and a second conductive line extending generally in parallel with one another within a lower interconnect layer over a row of memory cells, the first conductive line and the second conductive line being coupled to memory cells of the row;
a first plurality of conductive line segments disposed within an intermediate interconnect layer over the lower interconnect layer, wherein conductive line segments of the first plurality of conductive line segments are coupled to different locations on the first conductive line and are electrically coupled in parallel with the first conductive line;
a second plurality of conductive line segments disposed in the intermediate interconnect layer, wherein conductive line segments of the second plurality of conductive line segments are coupled to different locations on the second conductive line and are electrically coupled in parallel with the second conductive line, the second plurality of conductive line segments being geometrically parallel to the first plurality of conductive line segments;
a third plurality of conductive line segments being disposed in an upper interconnect layer disposed over the intermediate interconnect layer, wherein conductive line segments of the third plurality of conductive line segments are coupled to different locations on the first conductive line and are electrically coupled in parallel with the first conductive line;
a fourth plurality of conductive line segments being disposed in the upper interconnect layer, wherein conductive line segments of the fourth plurality of conductive line segments are coupled to different locations on the second conductive line and are electrically coupled in parallel with the second conductive line, the fourth plurality of conductive line segments being geometrically parallel to the second plurality of conductive line segments;
wherein the memory device comprises a memory array region and a peripheral region spaced apart from the memory array region, wherein the first, second, third, and fourth plurality of conductive line segments are arranged generally in parallel in a first direction over the memory array region;
wherein the lower interconnect layer comprises the first conductive line over the memory array region and a fifth plurality of conductive line segments in the peripheral region, the fifth plurality of conductive line segments arranged in parallel with the first conductive line;
wherein the intermediate interconnect layer comprises the second plurality of conductive line segments over the memory array region and a sixth plurality of conductive line segments in the peripheral region, the sixth plurality of conductive line segments arranged perpendicular to the second plurality of conductive line segments; and
wherein the upper interconnect layer comprises the third plurality of conductive line segments over the memory array region and a seventh plurality of conductive line segments in the peripheral region, the seventh plurality of conductive line segments arranged in parallel with the third plurality of conductive line segments.

19. The memory device of claim 18, wherein the lower interconnect layer is immediately adjacent to the intermediate interconnect layer with only one layer of vias electrically connecting the lower interconnect layer to the intermediate interconnect layer.

20. The memory device of claim 18, wherein the intermediate interconnect layer is immediately adjacent to the upper interconnect layer with only one layer of vias electrically connecting the intermediate interconnect layer to the upper interconnect layer.

* * * * *